United States Patent
Sirna et al.

[11] Patent Number: 6,127,847
[45] Date of Patent: Oct. 3, 2000

[54] HIGH-SPEED BIPOLAR-TO-CMOS LOGIC CONVERTER CIRCUIT

[75] Inventors: Guglielmo Sirna, Palermo; Giuseppe Palmisano, Tremestieri Etneo; Mario Paparo, San Giovanni La Punta, all of Italy

[73] Assignees: SGS—Thomson Microelectronics S.r.l., Agrate Brianza; Consorzio per la Ricerca sulla Microelettronica nel Mezzogiorno, Catania, both of Italy

[21] Appl. No.: 09/088,380

[22] Filed: Jun. 1, 1998

[30] Foreign Application Priority Data

Jun. 5, 1997 [IT] Italy .................................. MI97A1333

[51] Int. Cl.[7] ...................... H03K 19/018; H03K 19/082

[52] U.S. Cl. .................................. 326/77; 326/75; 326/89

[58] Field of Search ................................. 326/75, 77–78, 326/89, 126, 66–67, 63

[56] References Cited

U.S. PATENT DOCUMENTS

| | | | |
|---|---|---|---|
| 4,939,393 | 7/1990 | Petty | 326/77 |
| 5,132,573 | 7/1992 | Tsuru et al. | 326/67 |
| 5,173,624 | 12/1992 | Gabillard et al. | 326/66 |
| 5,287,019 | 2/1994 | Nonaka et al. | 326/66 |
| 5,434,518 | 7/1995 | Sinh et al. | 326/66 |
| 5,485,106 | 1/1996 | Drost et al. | 326/66 |

*Primary Examiner*—Jon Santamauro
*Attorney, Agent, or Firm*—Wolf, Greenfield & Sacks, P.C.; James H. Morris; Theodore E. Galanthay

[57] ABSTRACT

A high-speed bipolar-to-CMOS logic converter circuit, including an input stage, including a differential amplifier meant to be connected to a bipolar-logic circuit portion and to be supplied by the supply voltage of the bipolar-logic portion, and an output stage, which is supplied by the voltage of a CMOS-logic circuit portion, a dynamic level shifting circuit interposed between the input stage and the output stage, the output stage being connected to the CMOS-logic circuit portion.

16 Claims, 4 Drawing Sheets

HIGH-SPEED BIPOLAR-TO-CMOS LOGIC CONVERTER CIRCUIT

BACKGROUND OF THE INVENTION

1. Field of the Invention

The present invention relates to a high-speed bipolar-to-CMOS logic converter circuit. More particularly, the invention relates to a converter circuit that allows to connection of a circuit portion provided in bipolar logic with another circuit portion provided in CMOS logic.

2. Discussion of the Related Art

Many conventional integrated circuits, used for example in the field of digital communications, use digital signal processing at a high clock rate.

Usually, a typical approach for the construction of these circuits is to divide the digital section of the circuit into two parts: one is produced in bipolar technology (ECL) while the other is produced in CMOS technology. In many digital signal processing systems, also those operating at a very high clock rate, an important part of the system operates with modest clock signals and therefore can be implemented by using CMOS techniques with results which are adequate for the requirements.

The possibility to implement the processing circuit by means of the two above-described technologies allows meeting the requirement of having increasingly high integration levels and bit rates; being able to meet this requirement is otherwise limited by the power consumption of bipolar circuits.

Two main drawbacks arise from the connection of bipolar digital circuits to digital circuits executed in CMOS technology, i.e., ECL logic circuits with CMOS logic circuits.

First, ECL logic states are not compatible with CMOS logic states; second, due to the need for temperature stability, the reference ground of a bipolar circuit is usually different from that of a CMOS circuit, as shown in FIG. 1, which illustrates a typical architecture of a bipolar and CMOS digital system.

In this figure, a main power supply line $V_{cc1}$ supplies a voltage regulator 1, which supplies a voltage (i.e., $V_{cc1}-V_{EE}$) which is temperature-stable for the bipolar circuit 2. Likewise, a voltage regulator 3 supplies a stable voltage $V_{cc2}$ to the CMOS circuit 4. In order to correctly interconnect the bipolar circuit 2 and the CMOS circuit 4 it is necessary to have a circuit for converting from bipolar logic to CMOS logic, designated by the reference numeral 5.

In many cases, the voltage $V_{cc1}$ is not regulated and varies by several hundred millivolts or by even more than one volt. In this case, it is necessary to provide a dynamic level shifting circuit in order to compensate for this variation. This increases the criticality and difficulty of the design of the converter circuit 5 used as interface between the bipolar digital portion and the CMOS digital portion of the system.

FIG. 2 illustrates a circuit solution commonly used for a bipolar-to-CMOS logic converter circuit.

This figure illustrates a switched current source, which is implemented by two bipolar transistors of the NPN type, designated by the reference numerals 6 and 7 and being coupled-emitter connected, and by two bipolar transistors of the PNP type, being current-mirror connected. This circuit inherently provides the required level shifter. However, the above-proposed circuit solution is affected by the fact that PNP transistors have poor performance; in particular, the PNP transistors used in circuits for radiofrequency applications are transistors of the lateral type with a very low cutoff frequency ($f_t$<100 MHz).

Since the output current in the circuit of FIG. 2 is switched by the PNP transistors 8 and 9, the maximum speed of the circuit cannot exceed a few megahertz.

A second conventional circuit solution is illustrated in FIG. 3 and again a coupled-emitter stage (with transistors 6 and 7 of the NPN type, similar to those of FIG. 1) is used but a fixed level shifter 10 is introduced. In this case, the drawbacks are due to the fact that there is a limited control of the driving current of the base of the output transistor 11 due to the variation in the voltage $V_{cc1}$ and to the saturation of the transistor 11 when the output OUT is in the low state. These drawbacks lead to high power consumption and to a low operating frequency.

SUMMARY OF THE INVENTION

The aim of the present invention is to provide a circuit for converting from bipolar logic to CMOS logic having a high conversion rate.

Within the scope of this aim, an object of the present invention is to provide a bipolar-to-CMOS logic converter circuit which achieves a high operating frequency.

Another object of the present invention is to provide a bipolar-to-CMOS logic converter circuit having lower power consumption than conventional circuits.

Another object of the present invention is to provide a bipolar-to-CMOS logic converter circuit which is stable.

Another object of the present invention is to provide a bipolar-to-CMOS logic converter circuit which is highly reliable, relatively easy to manufacture and at competitive costs.

This aim, these objects and others which will become apparent hereinafter are achieved in one embodiment by a high-speed bipolar-to-CMOS logic converter circuit, which includes an input stage, including a differential amplifier meant to be connected to a bipolar-logic circuit portion and to be supplied by the supply voltage of the bipolar-logic portion, and an output stage, which is supplied by the voltage of a CMOS-logic circuit portion, and a dynamic level shifting circuit interposed between the input stage and the output stage, the output stage being connected to the CMOS-logic circuit portion.

BRIEF DESCRIPTION OF THE DRAWINGS

Further characteristics and advantages of the present invention will become apparent from the following detailed description of a preferred but not exclusive embodiment of the circuit according to the invention, illustrated only by way of non-limitative example in the accompanying drawings, wherein.

It should be noted that in all figures, identical reference numerals designate identical elements.

DETAILED DESCRIPTION

Figure 1:
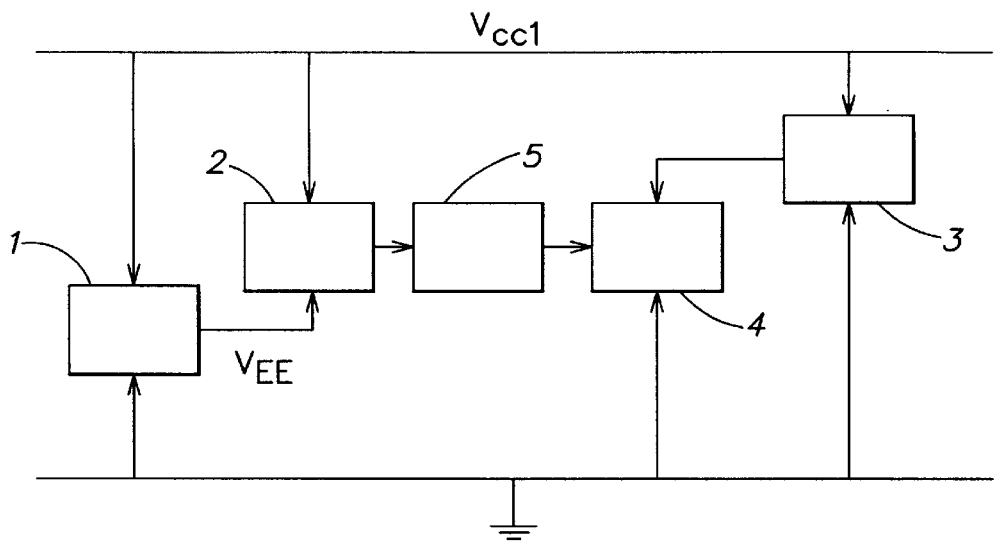
FIG. 1 is a block diagram of a typical architecture of a bipolar and CMOS digital system.
Figure 2:
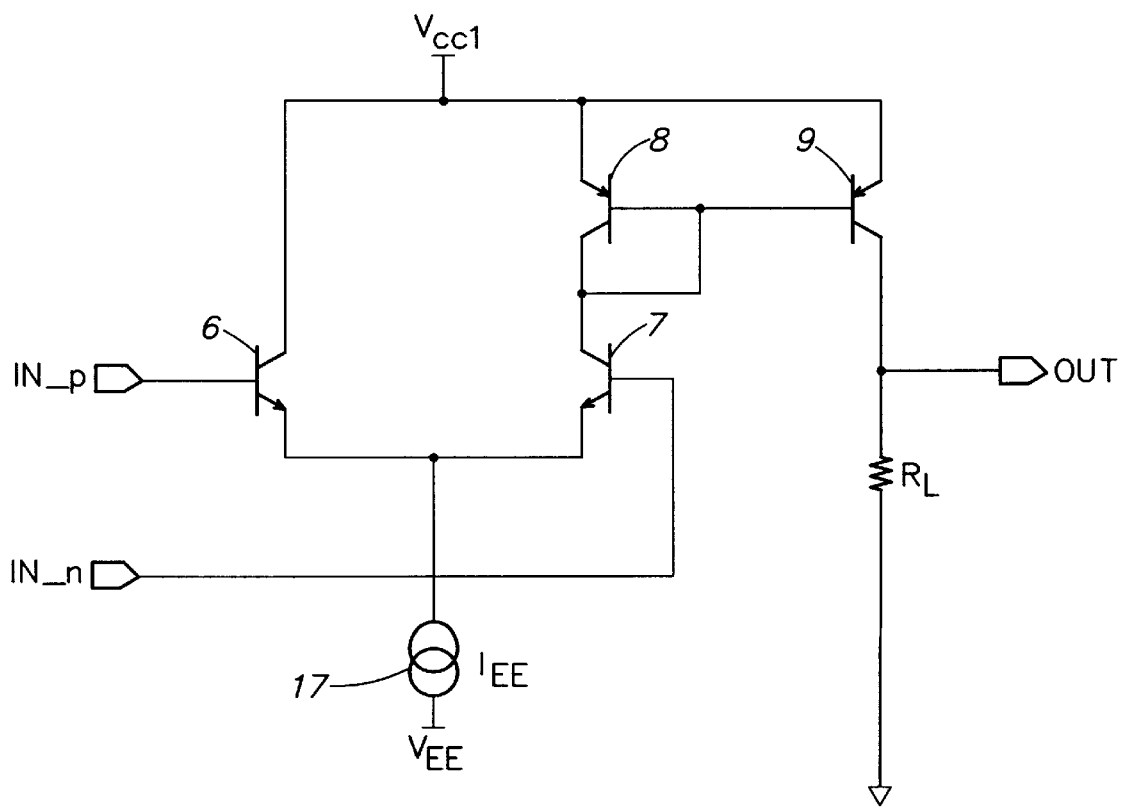
FIG. 2 is a circuit diagram of a bipolar-to-CMOS logic converter circuit using transistors of the PNP type, according to a first conventional embodiment.
Figure 3:
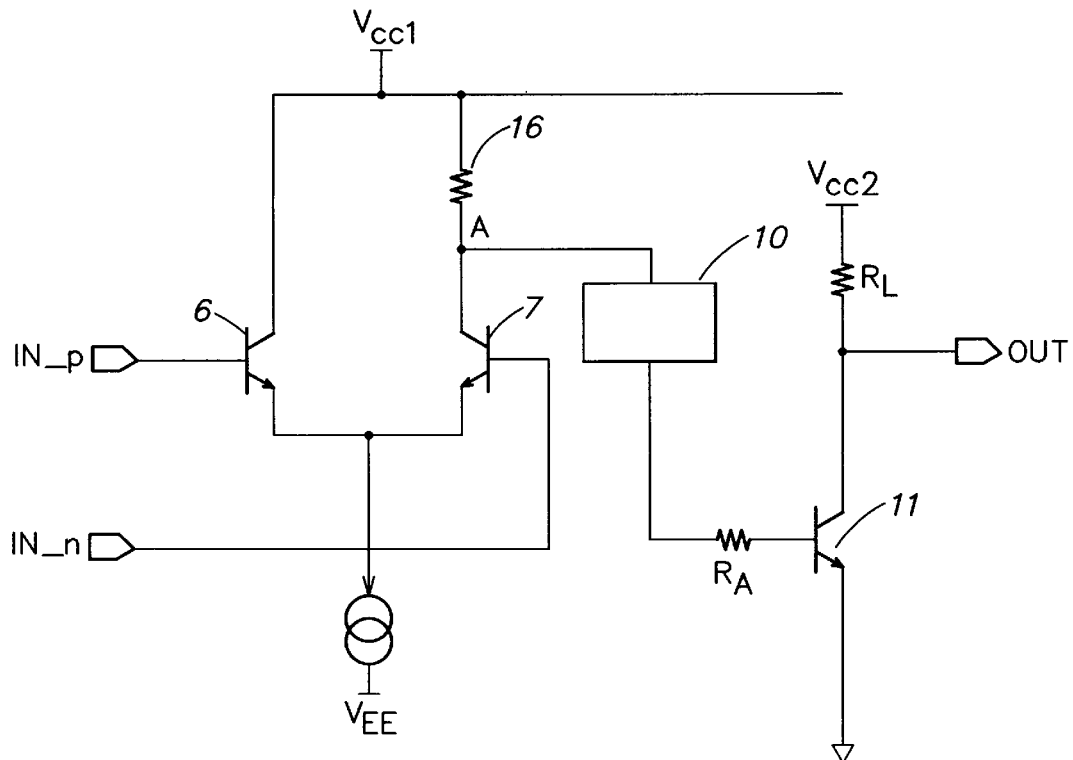
FIG. 3 is a circuit diagram of a bipolar-to-CMOS logic converter circuit using a fixed level shifter, according to a second conventional embodiment.
Figure 4:
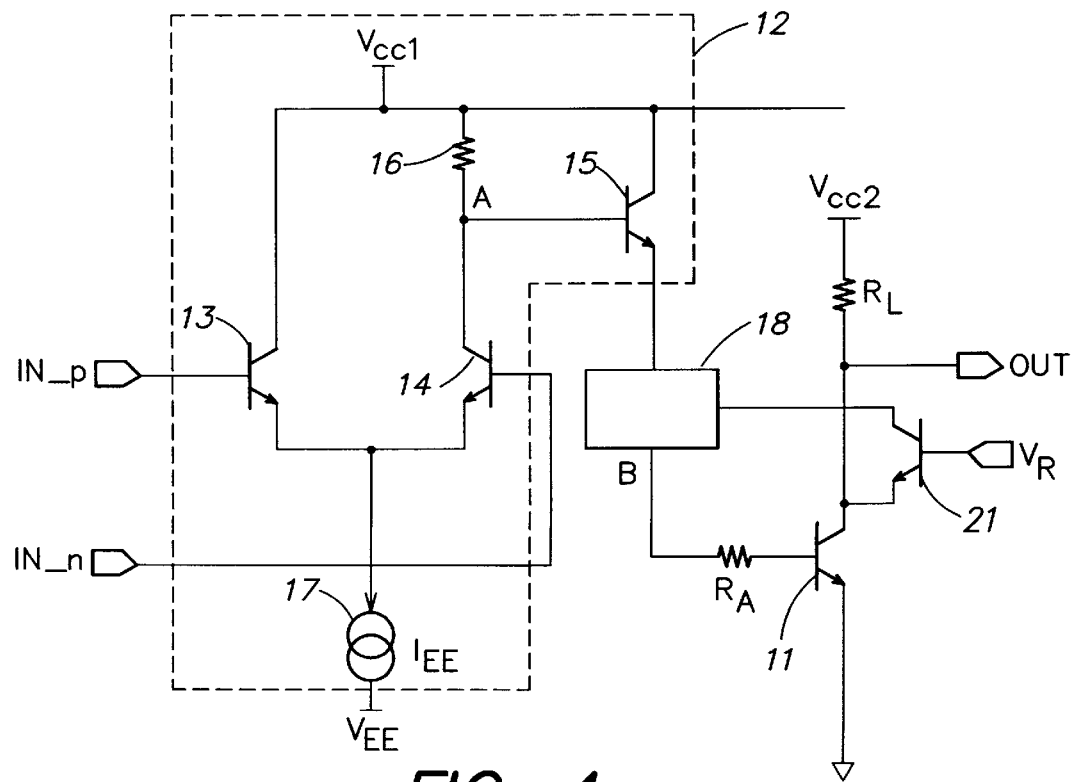
FIG. 4 is a simplified circuit diagram of the bipolar-to-CMOS logic converter circuit according to the present invention.
Figure 5:
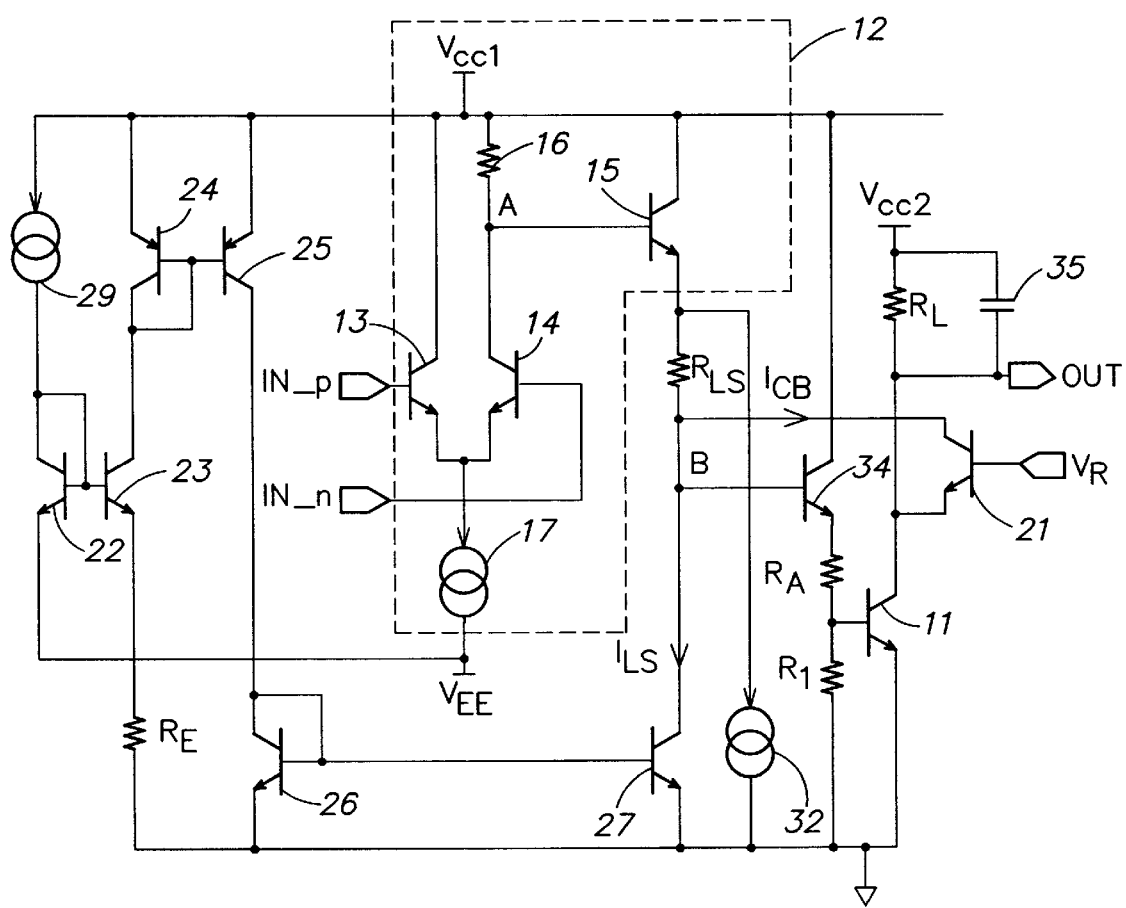
FIG. 5 is a detailed circuit diagram of the bipolar-to-CMOS logic converter circuit according to the present invention.

With reference to the above figures, the converter circuit according to the present invention, illustrated in FIGS. 4 and 5, includes a first stage 12, which is constituted by transistors 13, 14, 15 (first, second and third transistors) of the NPN type, by a first resistor 16, and by a first current source 17, and is similar to an ECL gate except for the fact that in the present case the output is not differential.

The transistors 13 and 14 are coupled-emitter connected and the collector of the transistor 13 is connected to the supply voltage $V_{cc1}$, like the transistor 14, which however has the resistor 16 interposed.

The base terminal of the transistor 15 is connected to the collector terminal of the transistor 14, at the point A shown in FIGS. 4 and 5.

A dynamic level shifting circuit 18 is connected to the emitter of the transistor 15.

A second resistor $R_A$ is connected in series to the level shifter 18 and is connected to the base of a fourth transistor 11, whose emitter is connected to the ground.

The resistor $R_A$ sets the base current of the transistor 11 in the low state.

The fourth transistor 11 and a third resistor $R_L$ constitute the output branch, which is supplied at the supply voltage $V_{cc2}$.

In a fifth feedback transistor 21 of the NPN type, the collector is connected to the level shifter 18, the emitter is connected to the collector of the transistor 11, and the base is connected to the reference voltage $V_R$.

The transistor 21 closes the feedback loop, which includes the level shifter 18, the resistor $R_L$ and the transistor 11.

FIG. 5 illustrates in detail the circuit according to the present invention, with the dynamic level shifter 18 shown explicitly.

The level shifting circuit 18 includes three circuit branches, each which is connected between the supply line $V_{cc1}$ and the ground line. The first branch includes a sixth transistor 22 and a current source 29; the second branch includes a seventh transistor 23, an eighth transistor 24 and a fourth resistor $R_E$; and the third branch includes a ninth transistor 25, a tenth transistor 26 and an eleventh transistor 27 which is connected thereto. The transistors 22, 23, 26 and 27 are of the NPN type.

In detail, the transistor 22 and the transistor 23 have a common base terminal, and in the transistor 22 the collector is connected to the base and to the supply line $V_{cc1}$ with a current source 29 and the emitter is instead connected to the voltage $V_{EE}$.

For the transistor 23, instead, the emitter is connected to the ground line by means of a fifth resistor $R_E$ and the collector is connected to the collector of the transistor 24, in which the base and the collector are common-connected; the emitter of the transistor 24 is instead connected to the supply line $V_{cc1}$.

The base of the transistor 24 is also connected to the base of the transistor 25, in which the emitter is connected to the supply line $V_{cc1}$ and the collector is connected to the collector of the transistor 26; for the transistor 26, the collector is connected to the base of said transistor and the emitter is instead connected to the ground line.

The base of the transistor 26 is connected to the base of the transistor 27, in which the emitter is connected to the ground; the collector of the transistor 27 is instead connected to the emitter of the transistor 15 with the interposition of a fifth resistor $R_{LS}$.

An additional resistor $R_1$ is connected between the base of the transistor 11 and the ground line, and a second current source 32 is connected between the ground line and the emitter of the transistor 15.

The resistor $R_1$ has the purpose of allowing quick discharge of the base of the transistor 11 during transition from the low state to the high state.

The current source 32 instead ensures a minimum biasing current to the transistor 15.

An additional transistor 34 is connected to the supply line $V_{cc1}$ by means of its collector, to one terminal of the resistor $R_A$ by means of its emitter, and to the collector of the transistor 27 by means of its base.

Finally, a charging capacitor 35 is parallel-connected to the resistor $R_L$.

The output terminal OUT constitutes the gate terminal of a CMOS gate, while the IN-n and IN-p terminals are the output terminals of a bipolar circuit.

With reference to the above figures, operation of the circuit according to the invention is as follows.

When the input (terminals IN-p and IN-n) is low, the voltage at the node A becomes low and its variation across the resistor 16 and the level shifting circuit is replicated at the node B. If the voltage of the node B thus becomes low, following the voltage of the node A, and reaches a sufficiently low value, the transistor 11 switches off and the output voltage on the output branch OUT of the circuit assumes the high state, which is equal to $V_{cc2}$ (supply voltage of the CMOS logic portion).

In the high state, the transistor 21 that closes the feedback loop on the level shifting circuit is off.

Instead, when the input is high, the voltages at the nodes A and B are also high and the output OUT of the circuit becomes low, different from the previous case.

The minimum value that the output OUT can assume, $V_{OMIN}$, is set by the reference voltage $V_R$ which is fed to the base of the transistor 21, according to the following equation.

$$V_{OMIN} = V_R - V_{BE21} \tag{1}$$

where $V_{BE21}$ is the voltage between the base and the emitter of the transistor 21.

When the output voltage reaches the value $V_{OMIN}$, the transistor 21 switches on (starts to conduct) and the current across the resistor $R_L$ reaches the maximum value, $I_{OMAX}$, which is given by the following relation:

$$I_{OMAX} = \frac{V_{CC2} - V_{OMIN}}{R_L} \tag{2}$$

The voltage $V_{OMIN}$ is set to the maximum value allowable for the low state of a CMOS gate. The collector current $I_{C11}$ of the transistor 11 is given by $$I_{CII} = \beta_{FII} \left[ \frac{V_B - V_{BE34} - V_{BEII}}{R_A} - \frac{V_{BEII}}{R_1} \right] \quad (3)$$

where $V_B$ is the voltage at the node B and $V_{BE11}$ is the voltage between the base and the emitter of the transistor 11.

The value of the current $I_{C11}$ is set by the feedback loop which, by acting on the level shifting circuit 18, reduces the voltage $V_B$ and brings the transistor 11 into the active region.

In this manner, the amount of charge in the base region of the transistor 11 is also reduced, allowing to achieve high-speed performance of said transistor.

Moreover, current control in the transistor 11 allows to reduce power consumption, preventing said consumption from reaching an excessive value.

With reference now to FIG. 5, which illustrates the level shifting circuit 18 in detail, the current $I_{LS}$ that flows through the resistor $R_{LS}$ and the voltage $V_{LS}$ across it are determined respectively, in the high state (when $I_{C21}$=0), by:

$$I_{LS} = \frac{V_{EE}}{R_E} \quad (4a)$$

$$V_{LS} = V_{EE} \frac{R_{LS}}{R_E} \quad (4b)$$

Since the voltage $V_{CC1}-V_{EE}$ is set by a voltage regulator, the variation of $V_{CC1}$ influences $V_{EE}$ and therefore $V_{LS}$, thus keeping the base voltage of the transistor 34 constant.

The driving current of the transistor 11 and the performance of the entire circuit therefore do not depend on the variation of the voltage $V_{cc1}$.

In particular, a specific characteristic of the invention is the current control that can be provided with the above-mentioned circuit.

Speed, stability and power consumption in fact depend considerably on the collector current $I_{C11}$ of the transistor 11 and on the collector current $I_{C21}$ of the transistor 21 in the low state.

The current $I_{C11}$ and the current $I_{C21}$ are set by the combined action of the feedback loop and of the level shifting circuit 18.

In the high state, the current $I_{C21}$ is equal to zero and the voltage $V_{LS}$ is determined merely by the current $I_{LS}$. In the low state, instead, the voltage $V_{LS}$ and therefore the base voltage of the transistor 34 are determined by both currents $I_{LS}$ and $I_{C21}$ ($I_{C21}$ produces an additional voltage drop on the resistor $R_{LS}$). Since the current through $R_L$ is set by equation (2) ($I_{OMAX}=I_{RL}$) according to the circuit requirements, the current $I_{C21}$ can be easily calculated as:

$$I_{C2I} \approx \frac{R_A}{\beta_{FII} R_{LS}} \left[ \beta_{FII} \left( \frac{V_B - V_{BE34} - V_{BEII}}{R_A} - \frac{V_{BEII}}{R_1} \right) - I_{RL} \right] \quad (5)$$

where the voltage $V_B$ is:

$$V_B = V_{CC1} - V_{BE15} - I_{LS} R_{LS} \quad (6)$$

where $V_{BE15}$ represents the voltage between the base and the emitter of the transistor 15.

In the low state, the feedback loop is active and a stable behavior of the circuit must be ensured. It is also necessary to set a unit gain frequency which is suitable for loop gain. Stability and speed It is also necessary to set a unit gain frequency which is suitable for loop gain. Stability and speed can be determined by using the transfer function T(S) of loop gain and therefore:

$$T(S) = g_{mII} R_{LS} \frac{r_{\pi 11}}{R_{11}} \frac{1}{1 + S r_{\pi 11} C_{\pi 11}} \frac{1}{1 - S \frac{g_{m2I}}{C_L}} \quad (7)$$

assuming that $$R_L \gg \frac{1}{g_{m2I}} \quad R_1 R_A \gg r_{\pi 11}$$

The dominant pole is due to the input resistance and to the capacitance of the transistor 11, while the second pole is determined by the transconductance $g_{m21}$ of the transistor 21 and by the charging capacitor 35. In order to ensure the required phase margin, it is necessary to correctly set the transconductance $g_{m21}$ and the current $I_{C21}$.

The unit gain frequency of the loop gain is determined by:

$$f_T = \frac{1}{2\pi} \frac{g_{mII} R_{LS}}{R_A C_{\pi 11}} \quad (8)$$

Due to the high current flowing across the transistor 11 in the low state, assuming $C_{\pi 11}$ to be equal to the diffusion capacitor, the unit gain frequency is determined by:

$$f_T \approx \frac{1}{2\pi} \frac{R_{LS}}{R_A} \frac{1}{\tau_F} \quad (9)$$

where $\tau_f$ is the transition time of the transistor 11.

Figure 6A:
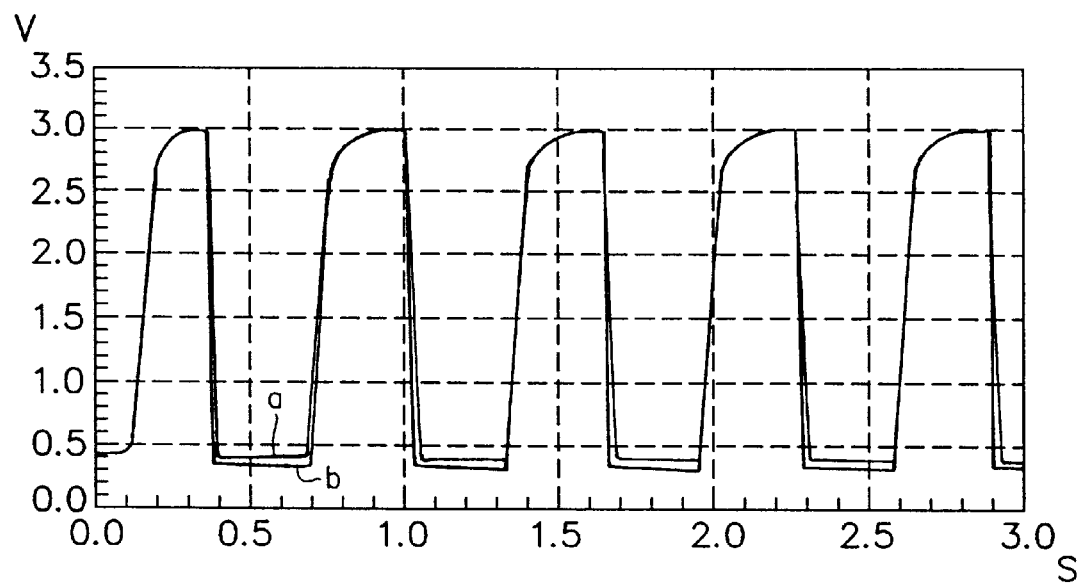
FIGS. 6A and 6B is a chart of the input and output signals of the bipolar-to-CMOS logic converter circuit according to the present invention.
Figure 6B:
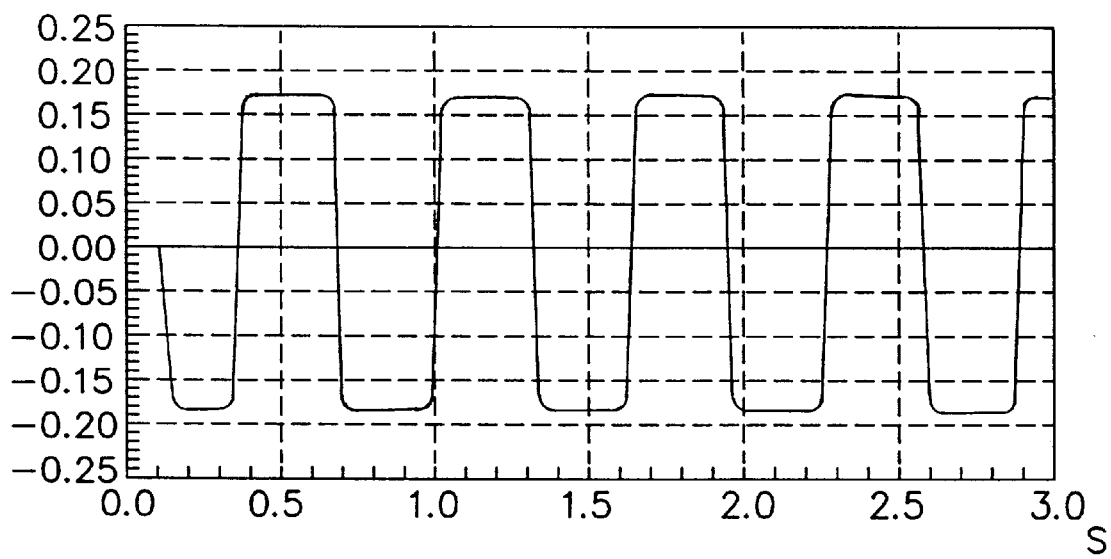

FIG. 6 is a chart which plots the behavior of the circuit according to the invention. In particular, the lower portion of the figure plots an input signal from a bipolar-logic circuit portion with a power supply $V_{CC1}$, while the upper portion of said figure plots the output voltage at the node OUT of the circuit according to the invention, for two different values of the supply voltage $V_{CC1}$ (the curves a and b of the upper chart are obtained, respectively, with two different values of the supply voltage $V_{CC1}$). The chart shows that the curves a and b substantially overlap, indicating that the value of the output voltage of the circuit is substantially invariant as the supply voltage of the bipolar-logic portion upstream of the circuit according to the invention varies.

In practice it has been observed that the bipolar-to-CMOS logic converter circuit according to the invention fully achieves the intended aim and objects, since it provides a converter whose output is independent of the variation of the supply voltage $V_{CC1}$ of the bipolar-logic portion upstream of which the circuit is interfaced.

The operating frequency and the power consumption of the circuit according to the invention are also improved with respect to known solutions.

The converter circuit thus described is susceptible of numerous modifications and variations, all of which are within the scope of the inventive concept; all the details may also be replaced with other technically equivalent elements.

In practice, the materials employed, so long as they are compatible with the specific use, as well as the dimensions, may be any according to requirements and to the state of the art.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A high-speed bipolar-to-CMOS logic converter circuit, comprising an input stage, including a differential amplifier supplied by a first supply voltage, and an output stage, which is supplied by a voltage of a CMOS-logic circuit portion, wherein a dynamic level shifting circuit is coupled between said input stage and said output stage, said output stage being connected to the CMOS-logic circuit portion;

said input stage including at least one input terminal and an output terminal, said differential amplifier including a first transistor and a second transistor, which are coupled-emitter connected, the output terminal of said input stage coupled to said dynamic level shifting circuit, said output stage including a first output transistor and an output resistor series-connected and for receiving a signal from the dynamic level shifting circuit, said output stage further including a second output transistor which is connected to a voltage regulator and constitutes, with said first output transistor, said output resistor and said dynamic level shifting circuit, a feedback loop for the output voltage of the converter circuit.

2. A circuit according to claim 1, wherein said input stage includes a third transistor, in which a base is connected to a collector of said first transistor and an emitter is connected to said dynamic level shifting circuit, said first, second and third transistors being connected, by means of their collectors, to said first supply voltage.

3. A circuit according to claim 2, wherein an input signal is applied to the bases of said first and second transistors, a input signal arriving from said bipolar-logic circuit portion, a first current source being connected to the emitters of said first and second transistors.

4. A circuit according to claim 2, wherein a first resistor is coupled between the collector of said second transistor and said first supply voltage.

5. A circuit according to claim 2, further comprising a resistor coupled between said dynamic level shifting circuit and said output stage.

6. A circuit according to claim 5, further comprising an additional resistor which is connected between the base of said fourth transistor and the ground.

7. A high-speed bipolar-to-CMOS logic converter circuit, comprising an input stage, including a differential amplifier supplied by a first supply voltage, and an output stage, which is supplied by a voltage of a CMOS-logic circuit portion, wherein a dynamic level shifting circuit is coupled between said input stage and said output stage, said output stage being connected to the CMOS-logic circuit portion;

wherein said input stage includes a first transistor and a second transistor, which are coupled-emitter connected, and by a third transistor, in which a base is connected to a collector of said first transistor and an emitter is connected to said dynamic level shifting circuit, said first, second and third transistors being connected, by means of their collectors, to said first supply voltage;

comprising a resistor coupled between said dynamic level shifting circuit and said output stage;

said output stage comprises a fourth transistor and a third resistor which are series-connected;

further comprising a fifth transistor which is connected to a voltage regulator and constitutes, with said fourth transistor, said second resistor and said dynamic level shifting circuit, a feedback loop for the output voltage of said converter circuit.

8. A circuit according to claim 7, wherein an emitter of said fifth transistor is connected to a collector of said fourth transistor and a collector of the fifth transistor is connected to said dynamic level shifting circuit.

9. A circuit according to claim 8, wherein said dynamic level shifting circuit comprises a sixth transistor which is interposed between said first supply voltage and said first current source, a seventh transistor and an eighth transistor which are coupled-collector connected and are interposed between said first power supply line and a fourth resistor connected to the ground, a ninth transistor and a tenth transistor which are common-collector connected and are interposed between said first supply voltage and the ground, and an eleventh transistor which is series-connected to a fifth resistor, which is in turn connected to the emitter of said third transistor.

10. A circuit according to claim 9, wherein the base of said eighth transistor is connected to the collector of said transistor and to the base of said ninth transistor.

11. A circuit according to claim 9, wherein the base of said tenth transistor is connected to the base of said eleventh transistor, whose emitter is connected to ground by means of a resistor.

12. A circuit according to claim 9, wherein an additional transistor is connected to said first supply voltage by means of its collector; to said second resistor by means of its emitter; and to the collector of said eleventh transistor by means of its base.

13. A circuit according to claim 9, wherein a second current source is connected between the ground and the emitter of said third transistor.

14. A circuit according to claim 9, wherein the collector of said fifth transistor is connected to the collector of said eleventh transistor.

15. A circuit according to claim 9, wherein the base and the collector of said sixth transistor are common-connected.

16. A circuit according to claim 9, wherein the base and the collector of said tenth transistor are common-connected.

* * * * *